(12) United States Patent
Han et al.

(10) Patent No.: US 8,987,758 B2
(45) Date of Patent: Mar. 24, 2015

(54) BARRIER FILM COMPOSITE AND DISPLAY APPARATUS INCLUDING THE BARRIER FILM COMPOSITE

(75) Inventors: Dong-Won Han, Yongin (KR); Robert Jan Visser, San Jose, CA (US); Lorenza Moro, San Jose, CA (US)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 149 days.

(21) Appl. No.: 12/981,045

(22) Filed: Dec. 29, 2010

(65) Prior Publication Data

US 2011/0198620 A1 Aug. 18, 2011

Related U.S. Application Data

(60) Provisional application No. 61/291,404, filed on Dec. 31, 2009.

(30) Foreign Application Priority Data

Dec. 6, 2010 (KR) .................. 10-2010-0123489

(51) Int. Cl.
*H01L 51/00* (2006.01)
*H05B 33/04* (2006.01)
*H01L 51/52* (2006.01)

(52) U.S. Cl.
CPC ............ *H05B 33/04* (2013.01); *H01L 51/5237* (2013.01); *H01L 51/0097* (2013.01); *H01L 51/5256* (2013.01); *H01L 2251/5338* (2013.01); *H01L 2251/558* (2013.01)
USPC ...................... 257/88; 257/100; 257/E33.055

(58) Field of Classification Search
CPC ............ H01L 51/5237; H01L 51/5253; H01L 51/5256; H01L 51/448
USPC ......... 257/40, 99, E25.009, E51.002, E51.02, 257/E51.022, 100
See application file for complete search history.

(56) References Cited

U.S. PATENT DOCUMENTS

| | | | |
|---|---|---|---|
| 4,652,490 | A | 3/1987 | Arita et al. |
| 5,260,095 | A | 11/1993 | Affinito |
| 5,300,353 | A | 4/1994 | Yoshimura et al. |
| 5,395,644 | A | 3/1995 | Affinito |
| 5,440,446 | A | 8/1995 | Shaw et al. |

(Continued)

FOREIGN PATENT DOCUMENTS

| | | |
|---|---|---|
| CN | 1841811 A | 10/2006 |
| EP | 1868256 A2 | 12/2007 |

(Continued)

OTHER PUBLICATIONS

Japanese Office Action issued Apr. 24, 2012 in connection with Japanese Patent Application Serial No. 2010-293239, which also claims U.S. Appl. No. 61/291,404 as its priority document, and Request for Entry of the Accompanying Office Action attached herewith.

(Continued)

*Primary Examiner* — Ermias Woldegeorgis
(74) *Attorney, Agent, or Firm* — Robert E. Bushnell, Esq.

(57) ABSTRACT

A barrier film composite includes a decoupling layer and a barrier layer. The barrier layer includes a first region and a second region that is thinner than the first region.

17 Claims, 4 Drawing Sheets

(56) References Cited

U.S. PATENT DOCUMENTS

| | | |
|---|---|---|
| 5,547,508 A | 8/1996 | Affinito |
| 5,691,615 A | 11/1997 | Kato et al. |
| 5,725,909 A | 3/1998 | Shaw et al. |
| 5,902,641 A | 5/1999 | Affinito et al. |
| 6,268,695 B1 | 7/2001 | Affinito |
| 6,522,067 B1 | 2/2003 | Graff et al. |
| 6,570,325 B2 | 5/2003 | Graff et al. |
| 6,866,901 B2 | 3/2005 | Burrows et al. |
| 7,198,832 B2 | 4/2007 | Burrows et al. |
| 7,560,747 B2 * | 7/2009 | Cok ................ 257/98 |
| 2003/0164674 A1 | 9/2003 | Imamura |
| 2004/0119068 A1 * | 6/2004 | Weaver ............ 257/40 |
| 2005/0051763 A1 | 3/2005 | Affinito et al. |
| 2005/0062052 A1 | 3/2005 | Yang et al. |
| 2005/0127829 A1 | 6/2005 | Takahashi |
| 2005/0176181 A1 | 8/2005 | Burrows et al. |
| 2005/0224935 A1 | 10/2005 | Schaepkens et al. |
| 2006/0159938 A1 | 7/2006 | Lee et al. |
| 2006/0220548 A1 | 10/2006 | Menda |
| 2006/0270305 A1 | 11/2006 | Imamura |
| 2007/0164376 A1 | 7/2007 | Burrows et al. |
| 2007/0196682 A1 | 8/2007 | Visser et al. |
| 2007/0210459 A1 | 9/2007 | Burrows et al. |
| 2007/0273972 A1 | 11/2007 | Okayasu |
| 2007/0281174 A1 | 12/2007 | Moro et al. |
| 2008/0035492 A1 * | 2/2008 | Hilliard ............ 205/688 |
| 2008/0176041 A1 | 7/2008 | Sato et al. |
| 2009/0174924 A1 * | 7/2009 | Kubota ............ 359/259 |
| 2009/0208754 A1 | 8/2009 | Chu et al. |
| 2009/0279285 A1 | 11/2009 | Nakayama et al. |
| 2010/0089636 A1 | 4/2010 | Ramadas et al. |
| 2010/0270919 A1 | 10/2010 | Hubert et al. |

FOREIGN PATENT DOCUMENTS

| | | | |
|---|---|---|---|
| JP | 60187544 | | 9/1985 |
| JP | 2-192691 A | | 7/1990 |
| JP | 2002231443 A | * | 8/2002 |
| JP | 2002240862 | | 8/2002 |
| JP | 2005026396 | | 1/2005 |
| JP | 2005111702 | | 4/2005 |
| JP | 2005251704 | | 9/2005 |
| JP | 2006094782 | | 4/2006 |
| JP | 2006114438 | | 4/2006 |
| JP | 2006127841 | | 5/2006 |
| JP | 2006297694 | | 11/2006 |
| JP | 2008279597 | | 11/2008 |
| JP | 2009193754 | | 8/2009 |
| JP | 2009252364 | | 10/2009 |
| JP | 2009259788 | | 11/2009 |
| JP | 2010052402 | | 3/2010 |
| KR | 1020040015360 | | 2/2004 |
| KR | 100576639 B | | 5/2006 |
| KR | 1020060084659 A | | 7/2006 |
| KR | 1020080009297 | | 1/2008 |
| KR | 1020100108392 A | | 10/2010 |
| TW | 200847841 A1 | | 12/2008 |
| TW | 200930137 A | | 7/2009 |

OTHER PUBLICATIONS

The Extended European Search Report issued by the European Patent Office on Jul. 28, 2011, in the examination of the European Patent Application No. 10252255.4 and Request for Entry attached herewith. (Corresponding cross-referenced Information Disclosure Statement, U.S. Appl. No. 12/981,353, filed on Oct. 26, 2011).
Extended European Search Report issued by the EPO on Feb. 25, 2013 in the corresponding European Patent Application No. 10252257.0.
Korean Office Action issued Aug. 3, 2012 in connection with Korean Patent Application Serial No. 10-2010-0123489 and Request for Entry of the Accompanying Office Action attached herewith.
Extended European Search Report issued by the EPO on Feb. 28, 2013 in the corresponding European Patent Application No. 10252256.2 (Filed Apr. 9, 2013 of cross-referenced U.S. Appl. No. 12/981,041;).
Japanese Patent Office dated Sep. 3, 2013 issued by JPO which connection with Japanese Patent Application No. 2010-293239 and also which claims Korean Patent Application No. 10-2010-0123489 with Request for Entry of the Accompanying Office Action.
Japanese Office Action dated Sep. 3, 2013 issued by JPO which connection with Japanese Patent Application No. 2010-293907 and also which claims Korean Patent Application No. 10-2010-0123483. (Filed Oct. 8, 2013 of cross-reference U.S. Appl. No. 12/981,353;).
Taiwanese Office Action issued by Taiwan Patent Office on Nov. 25, 2013 in connection with Taiwanese Patent Application No. 91146964 which also claims Korean Patent Application No. 10-2010-0123489 as its priority document and priority from the present application and Request for Entry of the Accompanying Office Action attached herewith.
Taiwanese Office Action issued by the Taiwan Patent Office on Dec. 5, 2013 in connection with Taiwanese Patent Application No. 99146959 which also claims Korean Patent Application No. 10-2010-0123483 as its priority document. (Filed Jan. 22, 2014 of cross-referenced U.S. Appl. No. 12/981,353).
Chinese Registration Determination Certificate issued by Chinese Intellectual Property Office on Apr. 16, 2014 in connection with Chinese Patent Application No. 201010624532.4 which also claims Korean Patent Application No. 10-2010-0123489 as its priority document and Request for Entry of the Accompanying Office Action attached herewith.
The European Office Action issued on Jul. 14, 2014 by EPO in connection with corresponding European Patent Application No. 10252257.0.

* cited by examiner

BARRIER FILM COMPOSITE AND DISPLAY APPARATUS INCLUDING THE BARRIER FILM COMPOSITE

CLAIM OF PRIORITY

This application makes reference to, incorporates into this specification the entire contents of, and claims all benefits accruing under 35 U.S.C. §119 from U.S. Provisional Patent Application No. 61/291,404 entitled "Stretchable multilayer barrier," filed Dec. 31, 2009, in the US Patent and Trademark Office, and Korean Patent Application No. 10-2010-0123489, filed Dec. 6, 2010, in the Korean Intellectual Property Office, the disclosures of which are incorporated herein by reference.

BACKGROUND OF THE INVENTION

1. Field of the Invention

The present invention relates to a barrier film composite and a display apparatus including the barrier film composite.

2. Description of the Related Art

Multilayer, thin film barrier composites having alternating layers of barrier material and decoupling material are well known. These composites are typically formed by depositing alternating layers of barrier material and decoupling material, such as by vapor deposition. Barrier layers made of barrier material are typically a few hundred Angstroms thick, while decoupling layers made of decoupling material are generally less than ten microns thick.

There is a demand for stretchable multilayer barrier film composites, and display apparatuses including such a barrier film composite.

SUMMARY OF THE INVENTION

One aspect of the present invention provides an improved stretchable barrier film composite.

Another aspect of the present invention provides a display apparatus including the improved stretchable barrier film composite.

According to an aspect of the present invention, there is provided a barrier film composite including a decoupling layer and a barrier layer. The barrier layer may include a first region and a second region that is thinner than the first region.

The barrier layer may include an inorganic material.

The barrier layer may include at least one selected from the group consisting of individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof.

The first region and the second regions may include a same material.

The second region may include a material having smaller mechanical strength than a material of the first region.

The second region may have varying thicknesses.

The thickness of the second region may become smaller toward a center of the second region from sides the second region.

The barrier layer may include a plurality of second regions.

A pitch between each pair of adjacent second regions may be same.

The barrier film composite may include alternating layers of at least one decoupling layer and at least one barrier layer.

The second regions in each barrier layer may do not overlap with those in adjacent barrier layers.

According to another aspect of the present invention, there is provided a display apparatus including a first substrate, a second substrate disposed opposite to the first substrate, and a light-emitting device between the first substrate and the second substrate. At least one of the first substrate and the second substrate may include the barrier film composite of any one of the embodiments described above.

The light-emitting device may include an organic light-emitting device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
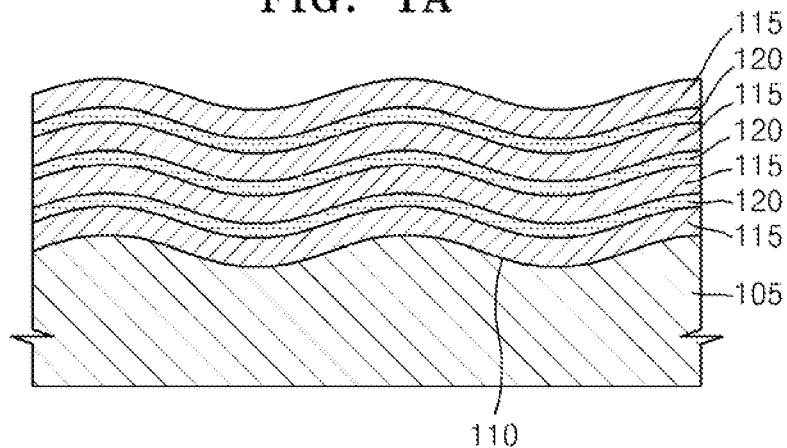
FIGS. 1A to 1C illustrate a barrier film composite constructed as an embodiment according to the principles of the present invention.

A film formed with multilayer barriers creates a barrier film with unsurpassed barrier performance, as described in U.S. Pat. No. 6,268,695, entitled "Environmental Barrier Material For Organic Light Emitting Device And Method Of Making," issued Jul. 31, 2001; U.S. Pat. No. 6,522,067, entitled "Environmental Barrier Material For Organic Light Emitting Device And Method Of Making," issued Feb. 18, 2003; U.S. Pat. No. 6,570,325, entitled "Environmental Barrier Material For Organic Light Emitting Device And Method Of Making", issued May 27, 2003; U.S. Pat. No. 6,866,901, entitled "Method for Edge Sealing Barrier Films", issued Mar. 15, 2005; U.S. Pat. No. 7,198,832, entitled "Method for Edge Sealing Barrier Films", issued Apr. 3, 2007; application Ser. No. 11/068,356, entitled "Method for Edge Sealing Barrier Films", filed Feb. 28, 2005; application Ser. No. 11/693,020, entitled "Method for Edge Sealing Barrier Films", filed Mar. 29, 2007; and application Ser. No. 11/693,022, entitled "Method for Edge Sealing Barrier Films", filed Mar. 29, 2007; application Ser. No. 11/776,616, entitled "Multilayer Barrier Stacks and Methods of Making Multilayer Barrier Stacks," filed Jul. 12, 2007; each of which is incorporated herein by reference.

The number of barrier stacks contained in the multilayer barrier film is not limited. The number of barrier stacks needed depends on the substrate material used and the level of permeation resistance needed for the particular application. One or two barrier stacks may provide sufficient barrier properties for some applications. The most stringent applications may require five or more barrier stacks.

The barrier stacks may include at least one decoupling layer and at least one barrier layer. There could be one decoupling layer and one barrier layer. There could be at least one decoupling layer on one side of at least one barrier layer. There could be at least one decoupling layer on both sides of at least one barrier layer. There could be at least one barrier layer on both sides of at least one decoupling layer. The important feature is that the barrier stack may include at least one decoupling layer and at least one barrier layer. The barrier layers in the barrier stacks may be made of the same material or of a different material as each other, and the decoupling layers may also be made of the same material or of a different material as each other.

Each one of the barrier layers is typically about 100 to about 2000 Å thick. In some embodiments, a first barrier layer may be thicker than barrier layers that are deposited later on the first barrier layer, if desired. For example, the first barrier layer may have a thickness of about 1000 Å to about 1500 Å, while later barrier layers may have a thickness of about 400 Å to about 500 Å. In some other embodiments, the first barrier layer may be thinner than later barrier layers. For example, the first barrier layer may have a thickness of about 100 Å to about 400 Å, while later barrier layers may have a thickness of about 400 Å to about 500 Å. Each one of the decoupling layers is typically about 0.1 to about 10 µm thick. In some embodiments the first decoupling layer may be thicker than later decoupling layers, if desired. For example, the first decoupling layer may have a a thickness of about 3 µm to about 5 µm, while later decoupling layers may have a thickness of about 0.1 µm to about 2 µm.

The barrier stacks may include the same or different layers, and the layers may be arranged in the same or different sequences.

The decoupling layers may be made froth the same decoupling material or different decoupling materials. The decoupling layers may be made of at least one selected from among, but not limited to, organic polymers, polymers including inorganic elements, organometallic polymers, hybrid organic/inorganic polymer systems, and combinations thereof. The organic polymers may be at least one selected from among, but not limited to, urethanes, polyamides, polyimides, polybutylenes, isobutylene isoprene, polyolefins, epoxies, parylenes, benzocyclobutadiene, polynorbornenes, polyarylethers, polycarbonates, alkyds, polyaniline, ethylene vinyl acetate, ethylene acrylic acid, and combinations thereof. The polymers including inorganic elements may be at least one selected from among, but not limited to, silicones, polyphosphazenes, polysilazanes, polycarbosilanes, polycarboranes, carborane siloxanes, polysilanes, phosphonitriles, sulfur nitride polymers, siloxanes, and combinations thereof. The organometallic polymers may be at least one selected from among, but not limited to, organometallic polymers of main group metals, transition metals, and lanthanide/actinide metals, and combinations thereof. The hybrid organic/inorganic polymer systems may be at least one selected from among, but not limited to, organically modified silicates, preceramic polymers, polyimide-silica hybrids, (methacrylate-silica hybrids, polydimethylsiloxane-silica hybrids, and combinations thereof.

The barrier layers may be made from the same barrier material or different barrier materials. The barrier layers can be made of any suitable barrier material. Suitable inorganic materials based on metals may be at least selected from among, but not limited to, individual metals, two or more metals as mixtures, inter-metallics or alloys, metal and mixed metal oxides, metal and mixed metal fluorides, metal and mixed metal nitrides, metal and mixed metal carbides, metal and mixed metal, carbonitrides, metal and mixed metal oxynitrides, metal and mixed metal borides, metal and mixed metal oxyborides, metal and mixed metal silicides, and combinations thereof. The metals may be at least one selected from among, not limited to, transition ("d" block) metals, lanthanide ("f" block) metals, aluminum, indium, germanium, tin, antimony and bismuth, and combinations thereof. Many of the resultant metal based materials will be conductors or semiconductors. The fluorides and oxides may be at least one selected from among, but not limited to, dielectrics (insulators), semiconductors and metallic conductors. The conductive oxides may be at least one selected from among, but not limited to, aluminum doped zinc oxide, indium tin oxide (ITO), antimony tin oxide, titanium oxides ($TiO_x$ where $0.8 \leq x \leq 1$), and tungsten oxides ($WO_x$ where $2.7 \leq x < 3.0$). Suitable inorganic materials based on p block semiconductors and non-metals may be at least one selected from among, but not limited to, silicon, silicon compounds, boron, boron compounds, carbon compounds including amorphous carbon and diamond-like carbon, and combinations thereof. The silicon compounds may be at least one selected from among, but not limited to, silicon oxides ($SiO_x$ where $1 \leq x \leq 2$), polysilicic acids, alkali and alkaline earth silicates, aluminosilicates ($Al_xSiO_y$), silicon nitrides ($SN_xH_y$ where $0 \leq y < 1$), silicon oxynitrides ($SiN_xO_yH_z$ where $0 \leq z < 1$), silicon carbides ($SiC_xH_y$ where $0 \leq y < 1$), and silicon aluminum oxynitrides (SiAlONs). The boron compounds may be at least one selected from among, but not limited to, boron carbides, boron, nitrides, boron oxynitrides, boron carbonitrides, and combinations thereof.

The barrier layers may be deposited by using any suitable process including, but not limited to, conventional vacuum processes such as sputtering, evaporation, sublimation, chemical vapor deposition (CVD), plasma enhanced chemical vapor deposition (PECVD), electron cyclotron resonance-plasma enhanced vapor deposition (ECR-PECVD), and combinations thereof.

The decoupling layers may be produced by using a number of known processes which provide improved surface planarity, including both atmospheric processes and vacuum processes. The decoupling layers may be formed by depositing a layer of liquid and subsequently processing the layer of liquid into a solid film. Depositing the decoupling layers as a liquid allows the liquid to flow over the defects in the substrate or a previous layer, fill in low areas, and cover up high points, providing a surface with significantly improved planarity. When the decoupling layers is processed into a solid film, the improved surface planarity is retained. Suitable processes for depositing a layer of liquid material and processing the liquid material into a solid film include, but are not limited to, vacuum processes and atmospheric processes. Suitable vacuum processes include, but are not limited to, those described in U.S. Pat. Nos. 5,260,095, 5,395,644, 5,547,508, 5,691,615, 5,902,641, 5,440,446, and 5,725,909, which are incorporated herein by reference. Liquid spreading apparatuses described in U.S. Pat. Nos. 5,260,095, 5,395,644, and 5,547,508 may be further configured to print liquid monomer in discrete, precisely placed regions of the receiving substrate.

Suitable atmospheric processes include, but are not limited to, spin coating, printing, ink jet printing, and/or spraying. Atmospheric processes refer to processes that run at pressures of about 1 atmosphere and can employ the ambient atmosphere. The use of atmospheric processes presents a number of difficulties including the need to cycle between a vacuum environment for depositing the barrier layer and ambient conditions for the decoupling layer, and exposure of the environmentally sensitive device to environmental contaminants, such as oxygen and moisture. One way to alleviate these problems is to use a specific gas (purge gas) during the atmospheric process to control exposure of the receiving substrate to the environmental contaminants. For example, the process may include cycling between a vacuum environment for barrier layer deposition and an ambient pressure nitrogen environment for the atmospheric process. Printing processes, including ink jet printing, allow the deposition of the decoupling layer in a precise area without the use of masks.

One way to make a decoupling layer involves depositing a polymer precursor, such as a (meth)acrylate containing polymer precursor, and then polymerizing it in situ to form the decoupling layer. As used herein, the term "polymer precursor" means a material which can be polymerized to form a polymer, including, but not limited to, monomers, oligomers, and resins. As another example of a method of making a decoupling layer, a preceramic precursor may be deposited as a liquid by spin coating and then converted to a solid layer. Full thermal conversion is possible for a film of this type directly deposited on a glass or oxide coated substrate. Although the deposited preceramic precursor cannot be fully converted to a ceramic at temperatures compatible with some flexible substrates, partial conversion to a cross-lined network structure would be satisfactory. Electron beam techniques could be used to crosslink and/or densify some of these types of polymers and can be combined with thermal techniques to overcome some of the substrate thermal limitations, provided the substrate can handle the electron beam exposure. Another example of making a decoupling layer involves depositing a material, such as a polymer precursor, as a liquid at a temperature above its melting point and subsequently freezing the liquid in place.

One method of making a barrier film composite includes providing a substrate, and depositing a barrier layer adjacent to the substrate at a barrier deposition station. The substrate with the barrier layer is moved to a decoupling material deposition station. A mask is provided with an opening which limits the deposition of the decoupling layer to an area which is smaller than, and contained within, the area covered by the barrier layer. The first layer deposited on the substrate may be either the barrier layer or the decoupling layer, depending on the design of the composite.

These multilayer barrier coatings and barrier films are relatively flexible. They were determined to typically only start cracking when wrapped over a 7 mm radius spindle. At present, the thin (about 60 nm) aluminum oxide barrier layers in the barrier coating start showing cracks around a 0.75% tensile strain. While optimization of the adhesion and materials might be able to shift the threshold of first cracks to higher values, it is unlikely that such a multilayer barrier film could be stretched to several percent elongation.

The pristine multilayer barrier film has been shown to be almost stress free (the tensile stress of the aluminum oxide layers is only 470 MPa, and the tensile stress of the polymers layers is even lower), resulting in processed films which are flat and which do not curl under heat treatment.

The barrier properties of the pristine multilayer barrier films have been shown to have a water vapor transmission rate (WVTR) of $1 \times 10^{-6}$ g/m$^2$/day.

The application of such stretchable barrier films could be to protect a wide range of environmentally sensitive materials and objects, ranging from flexible displays and solar cells to car bumpers used for corrosion protection and medical applications.

Instead of applying a wet or spray coating to a three dimensional object (paint for instance), more and more industries prefer a moldable coating which can be wrapped on the object (e.g., a car bumper) without the need for the manufacturing company to conduct wet processing with environmentally unfriendly chemicals and having to deal with the resulting contaminant and waste effluent problems.

Another application of stretchable barrier film composites is as a barrier coating on the exterior of a three dimensional object, which may be created by putting a barrier film in a mold and injecting plastic into the mold.

Medical packaging for individual pills pockets using the multilayer barrier film is another potential application of stretchable barrier film composites.

There are a number of ways to realize such structures. These methods make use of the flexibility of the barrier layer or take into account that the barrier layers may break on stretching.

The purpose of the invention is either to prevent barrier layers from cracking or to minimize and compensate for cracks. The resulting barrier might not meet a WVTR of $1 \times 10^{-6}$ g/m$^2$/day, but the resulting barrier may still have a good WVTR that is about 100 times better than a homogenous barrier film such as a polychlorotrifluoroethylene film (e.g., ACLAR® film available from Honeywell International, Inc.).

Figure 1B:
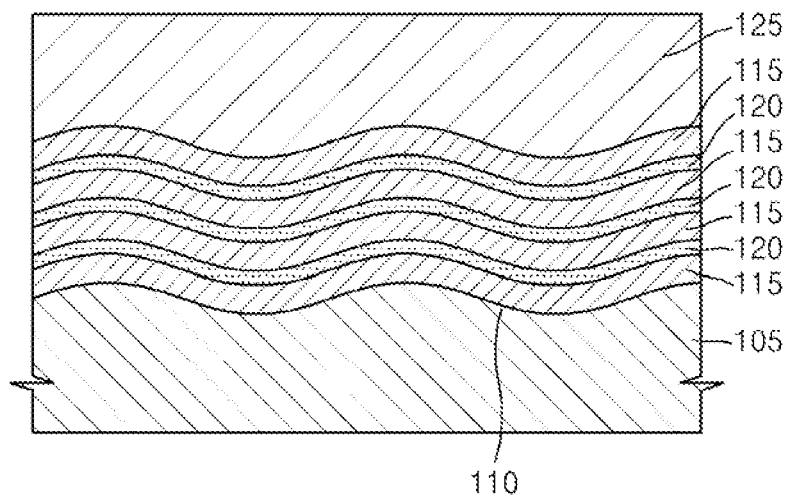
Figure 1C:
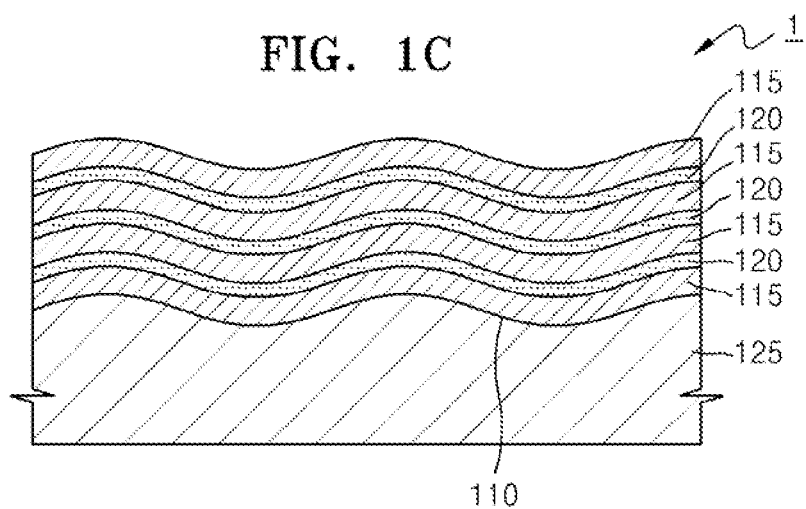

FIGS. 1A to 1C illustrate a barrier film composite 1 and a method for manufacturing the barrier film composite 1, as an embodiment according to the principles of the present invention.

Referring FIG. 1A, a mold 105 is provided with an undulating surface 110. The mold 105 having the undulating surface 110 may be formed by embossing or photolithography.

Decoupling layers 115 and barrier layers 120 are alternately stacked on the mold 105, and conform to shape of the surface 110 of the mold 105. The decoupling layers 115 and the barrier layers 120 form a very soft, elastic undulating structure, which is stretchable. In particular, a decoupling layer 115 is coated on the surface 110 of the mold 105, and a barrier layer 120 is then sputtered over and conforms to the surface of decoupling layer 115. Although FIGS. 1A to 1C illustrate an example in which the decoupling layer 115 directly formed on the surface 110 of the mold 105, the deposition order of the decoupling layer 115 and the barrier layer 120 may be reversed. That is, the barrier layer 120 may be directly formed on the surface 110 of the mold 105, and then the decoupling layer 115 may be formed on the surface of the barrier layer 120. The decoupling layers 115 may include, but are not limited to, cross-linked acrylates with low glass transition temperatures (Tg), for example, ranging from about −80° C. to about 40° C. The process of forming alternating layers of decoupling layers 115 and barrier layers 120 conforming to one another may be repeated as many times as necessary.

Referring to FIG. 1B, a film 125 is laminated on a surface of the alternating decoupling layers 115 and barrier layers 120. The film 125 also has an undulating surface due to the undulating structure of the decoupling layers 115 and barrier layers 120. The film 125 is formed from a stretchable material. Thus, the film 125 has a stretchable structure. The film 125 may include, but is not limited to, at least one selected from among polyethylene, polypropylene, polycarbonate, and combinations thereof.

Referring to FIG. 1C, the mold 105 is released from a barrier film composite 1 that includes the alternating layers of decoupling layers 115 and barrier layers 120, and the film 125. In order to facilitate the release of the mold 105 from the barrier film composite 1, the adhesion between the surface 110 of the mold 110 and the layer in direct contact with the surface 110 may be weaker than the adhesion between the film 125 and the alternating layers of decoupling layers 115 and barrier layers 120.

As a result, the barrier film composite 1, including the alternating layers of decoupling layers 115 and barrier layers 120, released from the mold 105 may provide a very soft, elastic polymer-based structure with an undulating surface. Instead of using wet or spay coating, the undulating structure is created by using molding with the mold 105, thereby alleviating environmental problems.

Figure 2:
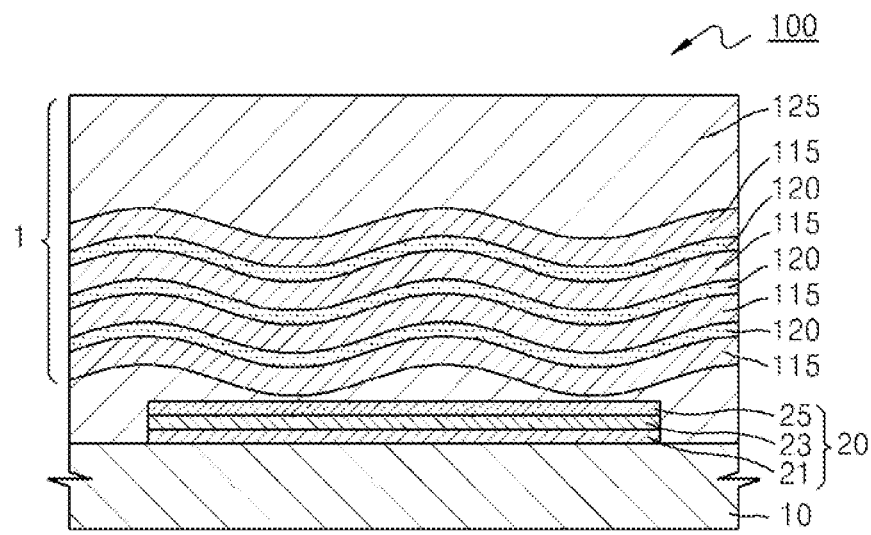
FIG. 2 illustrates an organic light-emitting display apparatus including the barrier film composite of FIG. 1C, constructed as an embodiment according to the principles of the present invention.

FIG. 2 illustrates an organic light-emitting display apparatus 100 including the barrier film composite 1 of FIG. 1C, constructed as an embodiment according to the principles of the present invention.

As described above, the barrier film composite 1 may be used for environmentally sensitive materials or objects, and may be used in a flexible display apparatus. Organic light-emitting display apparatuses include organic emission layers that are vulnerable to oxygen and moisture, and there is also an increasing demand for flexible display apparatuses as next-generation display apparatuses.

Referring to FIG. 2, the organic light-emitting display apparatus 100 includes an organic light-emitting device 20 on a surface of a substrate 10, and the barrier film composite 1, which encapsulates the organic light-emitting device 20. Although FIG. 2 illustrates an exemplary application of the barrier film composite 1 as an encapsulating material for the organic light-emitting device 20, aspects of the present invention are not limited thereto. The barrier film composite 1 may also be used as the substrate 10. When the barrier film composite 1 is used only to encapsulate the organic light-emitting device 20, the substrate 10 may include a flexible material, such as plastics or polyimides.

The organic light-emitting device 20 includes a first electrode layer 21, an organic emission layer 23, and a second electrode layer 25.

The first electrode layer 21 and the second electrode layer 25 may be used as either an anode or a cathode. Each one of the first electrode layer 21 and the second electrode layer 25 may be used as one of a reflective electrode, a transparent electrode, and a semi-transparent electrode.

The organic emission layer 23 may include a low-molecular weight organic material or a large-molecular weight organic material. When the organic emission layer 23 includes a low-molecular weight organic material, a hole transport layer (HTL) and a hole injection layer (HIL) may be sequentially disposed on a surface of the organic emission layer 23, and an electron transport layer (ETL) and an electron injection layer (EIL) may be sequentially disposed on the opposite surface thereof. Other various kinds of layers may be further laminated, if needed. Examples of suitable low-molecular weight organic materials include copper phthalocyanine (CuPc), N'-di(naphthalene-1-yl)-N,N'-diphenyl-benzidine (NPB), tris-8-hydroxyquinoline aluminum (Alq3), and the like. When the organic emission layer 23 includes a large-molecular weight material, a HTL may be further included, in addition to the organic emission layer 23. The HTL may be formed from poly-(2,4)-ethylene-dihydroxy thiophene (PEDOT), polyaniline (PANI), or the like. Examples of suitable large-molecular weight organic materials include polyphenylenevinylenes (PPV), polyfluorenes, and the like.

The organic light-emitting display device 100 including the barrier film composite 1 as described above may have a soft, elastic structure, enabling the manufacture of a flexible display. The barrier film composite 1 does not crack or is less likely to crack, and thus may protect the organic emission layer 23 from external moisture and oxygen.

Although the current embodiment has been described focusing on an organic light-emitting display apparatus, aspects of the present invention are not limited thereto. That is, the barrier film composite 1 may be used in various types of display apparatuses.

Figure 3A:
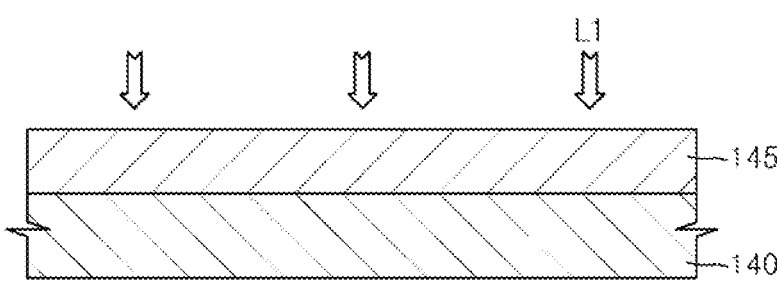
FIGS. 3A to 3C illustrate a barrier film composite, constructed as another embodiment according to the principles of the present invention.
Figure 3B:
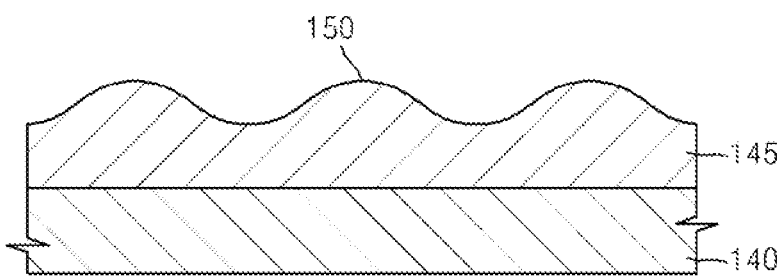
Figure 3C:
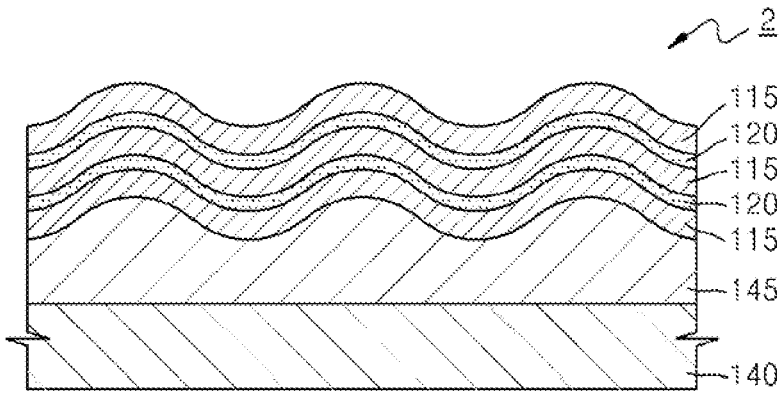

FIGS. 3A to 3C illustrate a barrier film composite 2 and a method for manufacturing the barrier film composite 2, as another embodiment according to the principles of the present invention.

Referring to FIG. 3A, a second layer 145 is formed on a first layer 140, and parts thereof are subjected to first irradiation (L1). The first layer 140 may include a flexible material, such as plastic. The second layer 145 may include a soft monomer. The first irradiation L1 may be laser writing, or irradiation through a mask.

Referring to FIG. 3B, as a result of the first irradiation (L1), the second layer 145 has an undulating surface 150. Specifically, one surface of the second layer 145 exposed to the first irradiation (L1) partially shrinks or expands resulting in an undulating surface, and then is fixed with second irradiation (not shown), resulting in the undulating surface 150.

Referring to FIG. 3C, alternating layers of decoupling layers 115 and barrier layers 120 are laminated on the undulating surface 150 of the second layer 145, as in the previous embodiment described above. The undulating surface 150 of the second layer 145 is transferred to the alternating layers of decoupling layers 115 and barrier layers 120, causing one surface thereof to undulate.

The first layer 140, the second layer 145 disposed on the first layer 140 with the undulating surface 150, and the undulating alternating layers of decoupling layers 115 and the barrier layers 120, as described above, form the barrier film composite 2, which may provide a very soft, elastic polymer-based undulating structure. Instead of using wet or spay coating, the undulating structure is created with light irradiation as described above, thereby alleviating environmental problems.

Figure 4:
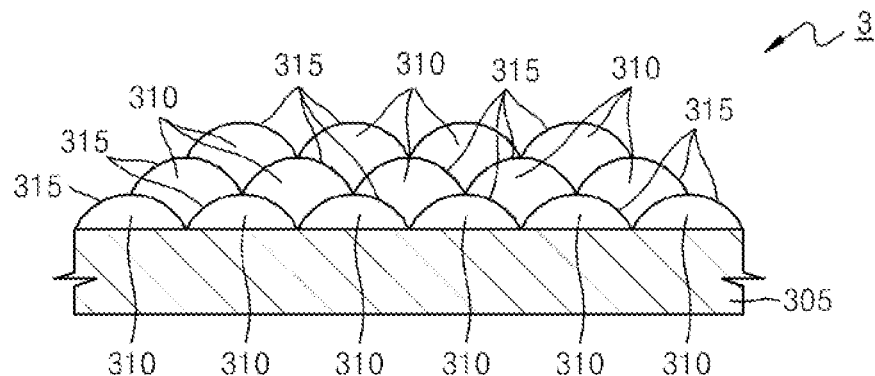
FIG. 4 illustrates a barrier film composite constructed as another embodiment according to the principles of the present invention.

FIG. 4 illustrates a barrier film composite 3 constructed as another embodiment according to the principles of the present invention.

A method of manufacturing a three-dimensional barrier, as described in U.S. application Ser. No. 11/627,583, filed Jan. 26, 2007 entitled "Three Dimensional Multilayer Barrier And Method Of Making", is incorporated herein by reference.

Referring to FIG. 4, bubbles of polymer material 310 are disposed on a substrate 305 and are surrounded by barrier material 315. The polymer material 310 is soft and stretchable. When stretched, most of the bubbles will elongate, but not break. While some bubbles may break, this will not provide a direct path to the outside because the break is covered by other bubbles.

Figure 5A:
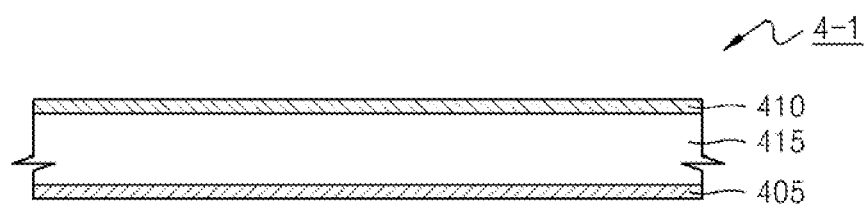
FIG. 5A illustrates a barrier film composite constructed as another embodiment according to the principles of the present invention.

FIG. 5A illustrates barrier film composite 4-1 constructed as another embodiment according to the principles of the present invention.

Referring to FIG. 5A, the barrier film composite 4-1 includes double barrier layers 405 and 410. Instead of a single barrier layer in the multiplayer structure, the double barrier layers 405 and 410 are separated from each other by a thin layer (about 10 nm to about 100 nm thick) of rubbery stretchable polymer 415. Suitable rubbery stretchable polymers include, but are not limited to, cross-linked acrylates with low Tg.

Figure 5B:
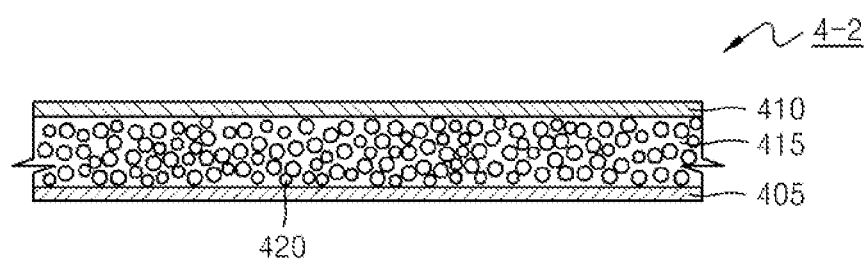
FIG. 5B illustrates a barrier film composite constructed as another embodiment according to the principles of the present invention.

FIG. 5B illustrates barrier film composite 4-2 constructed as another embodiment according to the principles of the present invention.

Referring to FIG. 5B, the barrier film composite 4-2 includes a getter material 420 in the polymer layer 415. The particle size of the getter material 420 may be on a nanometer scale, for example, may be from about 1 nm to about 100 nm. Alternatively, the rubbery, stretchable polymer layer 415 may contain inorganic oxide or nitride particles to create a tortuous path for moisture.

Figure 6:
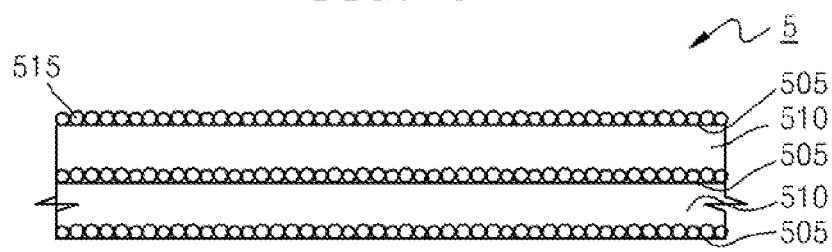
FIG. 6 illustrates a barrier film composite constructed as another embodiment according to the principles of the present invention.

FIG. 6 illustrates a barrier film composite 5 constructed as another embodiment according to the principles of the present invention.

Referring to FIG. 6, the barrier film composite 5 includes alternating layers of inorganic barrier layers 505 and decoupling layers 510. Each of the inorganic barrier layers 505 is covered by a thin layer of getter material 515. When stretched, the inorganic barrier layers 505 may crack, but the getter layer 515 will reduce the impact of the cracks.

Figure 7:
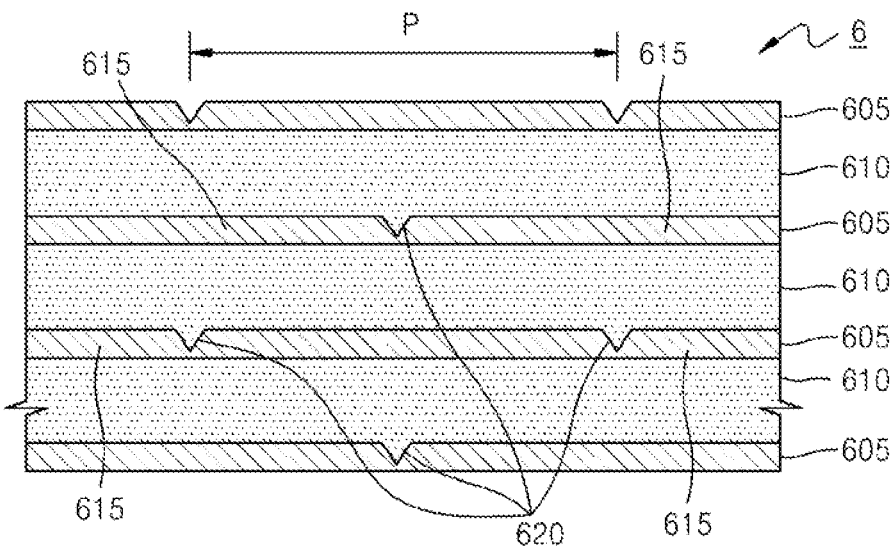
FIG. 7 illustrates a barrier film composite constructed as another embodiment according to the principles of the present invention.

FIG. 7 illustrates a barrier film composite 6 constructed as another embodiment according to the principles of the present invention.

Referring to FIG. 7, the barrier film composite 6 includes alternating layers of barrier layers 605 and decoupling layers 610.

The barrier layers 605 may be made of barrier materials. The barrier materials may include inorganic materials. In some embodiments, the barrier materials may include at least one material selected from among individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof, as listed above.

Each of the barrier layers 605 includes a first region 615, and a second region. 620 that is thinner than the first region 615. The second region 620 has less mechanical strength than the first region 615. When the barrier film composite 6 is stretched, the second region 620 alleviates stress and helps the barrier film composite 6 elongate.

The first region 615 and the second region 620 may be formed from the same material. Alternatively, the first region 615 and the second region 620 may be formed from different materials. For example, the second region 620 may include a material having smaller mechanical strength than a material forming the first region 615.

The second region 620 may have varying thicknesses. As illustrated in FIG. 7, the thickness of the second region 620 may decrease toward a center thereof from sides thereof with a wedged cross-section. However, aspects of the present invention are not limited thereto.

Each of the barrier layers 605 may include a plurality of second regions 620. A pitch between each pair of adjacent second regions 620 may be same. However, aspects of the present invention are not limited thereto. The plurality of second regions 620 may be formed with a shadow mask. However, aspects of the present invention are not limited thereto.

In the barrier film composite 6 with the plurality of barrier layers 605, the second regions 620 in each barrier layer 605 may be positioned so as not to overlap with those in other barrier layers 605. Thus, even if cracking occurs as the barrier film composite 6 is stretched, the barrier layers 605, including the second regions 620, may reduce the impact of the cracks, since the pitch P between each two adjacent second regions 620 in each barrier layer 605 is also extended, thereby elongating potential external contamination paths, which may be formed by the second regions 620.

Figure 8:
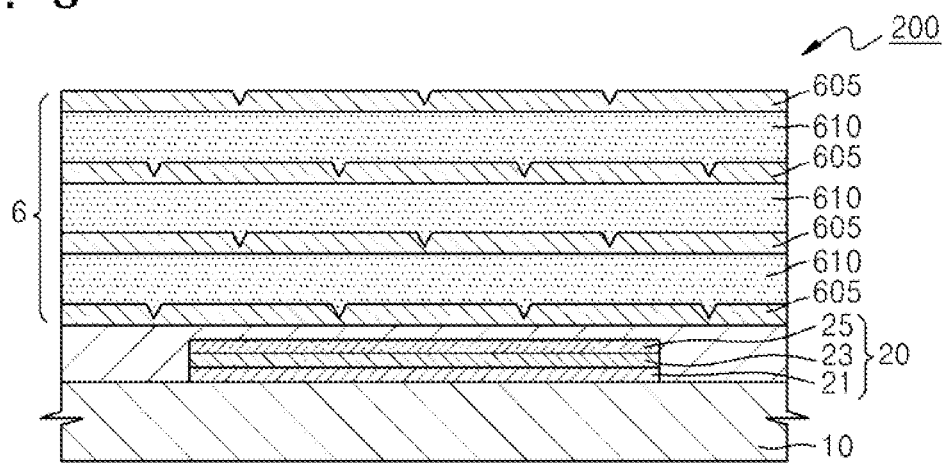
FIG. 8 illustrates an organic light-emitting display apparatus including the barrier film composite of FIG. 7, constructed as another embodiment according to the principles of the present invention.

FIG. 8 illustrates an organic light-emitting display apparatus 200 including the barrier film composite 6 of FIG. 7, constructed as another embodiment according to the principles of the present invention.

Referring to FIG. 8, the organic light-emitting display apparatus 200 includes an organic light-emitting device 20 formed on a surface of a substrate 10, and the barrier film composite 6, which encapsulates the organic light-emitting device 20. Although FIG. 8 illustrates an exemplary application of the barrier film composite 6 as an encapsulating material for the organic light-emitting device 20, aspects of the present invention are not limited thereto. The barrier film composite 6 may also be used as the substrate 10. When the barrier film composite 6 is used only to encapsulate the organic light-emitting device 20, the substrate 10 may include a flexible material, such as plastics or polyimides.

The organic light-emitting device 20 includes a first electrode layer 21, an organic emission layer 23, and a second electrode layer 25. A detailed description of the organic light-emitting device 20 will not be provided here, since the organic light-emitting device 20 has already been described above in connection with the organic light-emitting display apparatus 100 of FIG. 2.

The organic light-emitting display device 200 including the barrier film composite 6 as described above may have a soft, elastic structure, enabling the manufacture of a flexible display. The barrier film composite 6 is less likely to crack, and thus may protect the organic emission layer 23 from external moisture and oxygen, even when cracking occurs, due to the pitch P extending between the second regions 620 and potential external contamination paths are elongated as the barrier film composite 1 is stretched.

Figure 9:
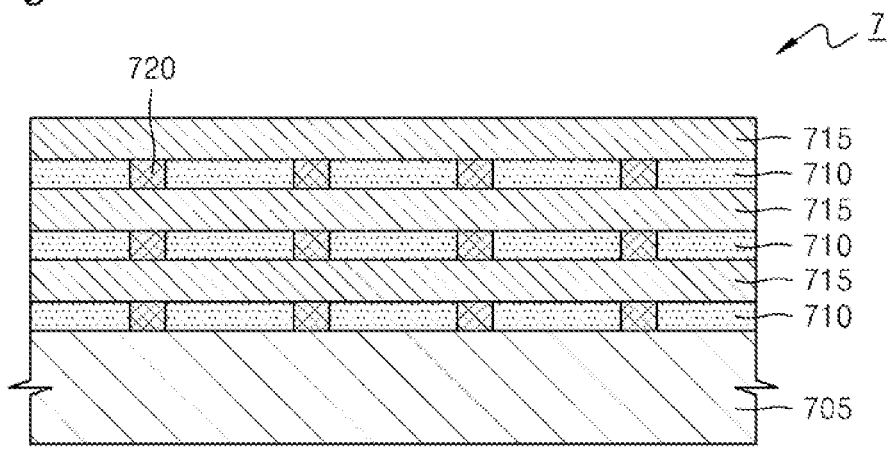
FIG. 9 illustrates a barrier film composite constructed as another embodiment according to the principles of the present invention.

FIG. 9 illustrates a barrier film composite 7 constructed as another embodiment according to the principles of the present invention.

Referring to FIG. 9, the barrier film composite 7 includes alternating layers of inorganic barrier layers 710 and decoupling layers 715 on a substrate 705. Metal ribs 720 may be disposed in the inorganic barrier layers 705, if partial loss of transparency is acceptable. Suitable materials for the metal ribs 720 include, but are not limited to, soft metals, alloys, tin (Sn), indium (In), and combinations thereof. The metal ribs 720 can be stretched without breaking. The metal ribs 720 may be two-dimensional.

As another embodiment according to the principles of the present invention, a method for making barrier film composites may involve making the inorganic barrier layers out of a very ductile soft metal or metal alloy, such as tin. The multiplayer structure will be semitransparent or even opaque, depending on the thickness and number of layers used. However, there are many applications for the stretchable multilayer barrier which do not require a transparent barrier.

As another embodiment according to the principles of the present invention, a method for making barrier film composites is to cover the inorganic barrier layers with a thin layer of nanoparticles of an inorganic oxide or nitride. The inorganic barrier layer may crack when it is stretched, but the nanoparticles should reduce the effect of the cracks by increasing the length of the undulating path.

As another embodiment according to the principles of the present invention, a method for making barrier film composites is to stretch a soft substrate and deposit the inorganic barrier layers on the substrate while it is being stretched. When the tension is released, the inorganic barrier layer will be compressed. This will allow some stretching of the inorganic layers when the structure is used.

As described above, according to the one or more embodiments of the present invention, a barrier film composite may provide a soft, stretchable barrier structure capable of alleviating stress. A display apparatus may be manufactured using the barrier film composite.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A stretchable barrier film composite, comprising alternately stacked layers of at least one decoupling layer and at least two barrier layers,
    each of the barrier layers comprising a first region and a second region,
    the second region being entirely a permeation barrier and having varying thicknesses which are thinner than that of the first region, and
    none of the second regions in each barrier layer overlaps with the second regions of the adjacent barrier layers.

2. The stretchable barrier film composite of claim 1, the barrier layer comprising an inorganic material.

3. The stretchable barrier film composite of claim 2, the barrier layer comprising at least one selected from the group consisting of individual metals, mixtures of at least two metals, inter-metallics, alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof.

4. The stretchable barrier film composite of claim 1, the first region and the second regions comprising the same material.

5. The stretchable barrier film composite of claim 1, the second region comprising a material having a mechanical strength smaller than that of a material of the first region.

6. The stretchable barrier film composite of claim 1, the thickness of the second region decreasing from the sides toward a center of the second region.

7. The stretchable barrier film composite of claim 1, the barrier layer comprising a plurality of second regions.

8. The stretchable barrier film composite of claim 7, a distance between the centers of a pair of adjacent second regions being the same for every pair of adjacent second regions.

9. The stretchable barrier film composite of claim 1 comprising tin.

10. The stretchable barrier film composite of claim 1, further comprising a thin layer of nanoparticles of an inorganic oxide or nitride covering the barrier layer.

11. A display apparatus having the barrier film composite of claim 1, comprising:
    a first substrate;
    a second substrate disposed opposite to the first substrate; and
    a light-emitting device between the first substrate and the second substrate,
    at least one of the first substrate and the second substrate comprising the barrier film composite.

12. The display apparatus of claim 11, the light-emitting device comprising an organic light-emitting device.

13. The display apparatus of claim 11, the barrier layer comprising an inorganic material.

14. The display apparatus of claim 11, the second region comprising a material having a mechanical strength smaller than that of a material of the first region.

15. The display apparatus of claim 11, the thickness of the second region decreasing from the sides toward a center of the second region.

16. The display apparatus of claim 11, the barrier film composite comprising alternating layers of at least one decoupling layer and at least one barrier layer.

17. The display apparatus of claim 11, at least one of the first substrate and the second substrate without the flexible barrier film composite.

* * * * *